US012665560B2

(12) United States Patent
Mauron et al.

(10) Patent No.: US 12,665,560 B2
(45) Date of Patent: Jun. 23, 2026

(54) SYSTEM AND METHOD FOR ADJUSTING THE AUDIO VOLUME OF A CHARGING CASE

(71) Applicant: Apple Inc., Cupertino, CA (US)

(72) Inventors: Thibaut X. Mauron, Cupertino, CA (US); Chandrahas Aralaguppe Chandramohan, San Jose, CA (US); Hugh H. Pham, San Jose, CA (US); Saurabh Saxena, Santa Clara, CA (US); Subodh Madiwale, San Jose, CA (US); Robert D. Zupke, Portola Valley, CA (US); Jahan C. Minoo, San Jose, CA (US); Justin T. Ng, San Jose, CA (US); Tharindu N. Silva, Sunnyvale, CA (US); Antonio R. De Lima Fernandes, Panaji (IN)

(73) Assignee: APPLE INC., Cupertino, CA (US)

( * ) Notice: Subject to any disclaimer, the term of this patent is extended or adjusted under 35 U.S.C. 154(b) by 154 days.

(21) Appl. No.: 18/654,931

(22) Filed: May 3, 2024

(65) Prior Publication Data

US 2025/0343521 A1     Nov. 6, 2025

(51) Int. Cl.
H04R 1/02         (2006.01)
G06F 3/16         (2006.01)
(Continued)

(52) U.S. Cl.
CPC .............. H03G 3/32 (2013.01); G06F 3/165 (2013.01); G08B 21/24 (2013.01); H02J 7/62 (2026.01);
(Continued)

(58) Field of Classification Search
CPC ...... H04R 1/021; H04R 1/028; H04R 1/1025; H04R 2420/07; H04R 2430/01;
(Continued)

(56) References Cited

U.S. PATENT DOCUMENTS

| | | | | | |
|---|---|---|---|---|---|
| 4,755,816 | A | * | 7/1988 | DeLuca | ............ H04W 52/0261 340/7.37 |
| 8,421,540 | B1 | * | 4/2013 | Bhattacharya | ............ H03F 3/21 330/207 P |

(Continued)

OTHER PUBLICATIONS

Hardwick, Tim. "AirPods Pro 2: How to Enable or Disable Charging Case Sounds." macrumors, Sep. 23, 2022, www.macrumors.com/how-to/airpods-pro-2-enable-disable-charging-case-sounds/. (Year: 2022).*

*Primary Examiner* — James K Mooney
(74) *Attorney, Agent, or Firm* — Kilpatrick Townsend & Stockton LLP

(57)         ABSTRACT

A charging case for a pair of wireless earphones, the charging case comprising: a housing having a peripheral wall that defines a shell and one or more audio openings formed through the peripheral wall; a frame insert coupled to the housing and extending into the shell, the frame insert having one or more insert walls that define first and second pockets sized and shaped to accept first and second wireless earphones, respectively; wherein the one or more insert walls cooperate with the housing peripheral wall to define a interior cavity within the charging case; a lid coupled to the housing and operable between a closed position in which the lid covers the first and second pockets and an open position in which the first and second pockets are exposed; a rechargeable battery disposed within the interior cavity; a speaker disposed within the interior cavity and aligned to emit sound through the one or more openings; and circuitry coupled to the battery and the speaker and configured to: initiate playing an audio asset on the speaker at a first gain level; while continuing to play the audio asset, increasing the gain level of the speaker from the first gain level to a final gain level by repeating a sequence of measuring a system load on the battery and increasing the gain level of the
(Continued)

speaker until the measured system load reaches a threshold level; after the measured system load reaches the threshold level, setting the gain level of the speaker at the final gain level and continuing playing the audio asset with the gain set at the final gain level.

25 Claims, 8 Drawing Sheets

(51) Int. Cl.

| | |
|---|---|
| *G08B 21/24* | (2006.01) |
| *H02J 7/62* | (2026.01) |
| *H02J 7/70* | (2026.01) |
| *H02J 7/82* | (2026.01) |
| *H03G 3/32* | (2006.01) |
| *H04R 1/1025* | (2026.01) |

(52) U.S. Cl.
CPC .............. *H02J 7/731* (2026.01); *H02J 7/825* (2026.01); *H04R 1/021* (2013.01); *H04R 1/028* (2013.01); *H04R 1/1025* (2013.01); *H02J 2207/30* (2020.01); *H04R 2420/07* (2013.01); *H04R 2430/01* (2013.01); *H04R 2499/11* (2013.01)

(58) Field of Classification Search
CPC . H04R 2499/11; G08B 21/24; H02J 7/00307; H02J 7/0044
See application file for complete search history.

(56) References Cited

U.S. PATENT DOCUMENTS

| | | | | |
|---|---|---|---|---|
| 2014/0009376 A1* | 1/2014 | Files | ................. | H02J 7/007182 |
| | | | | 323/299 |
| 2015/0349737 A1* | 12/2015 | Svendsen | ................ | H03F 3/181 |
| | | | | 455/84 |
| 2023/0269513 A1* | 8/2023 | Cousins | ............... | H04R 1/1075 |
| | | | | 381/171 |
| 2024/0078079 A1* | 3/2024 | Carrigan | ............ | G06F 3/04883 |

* cited by examiner

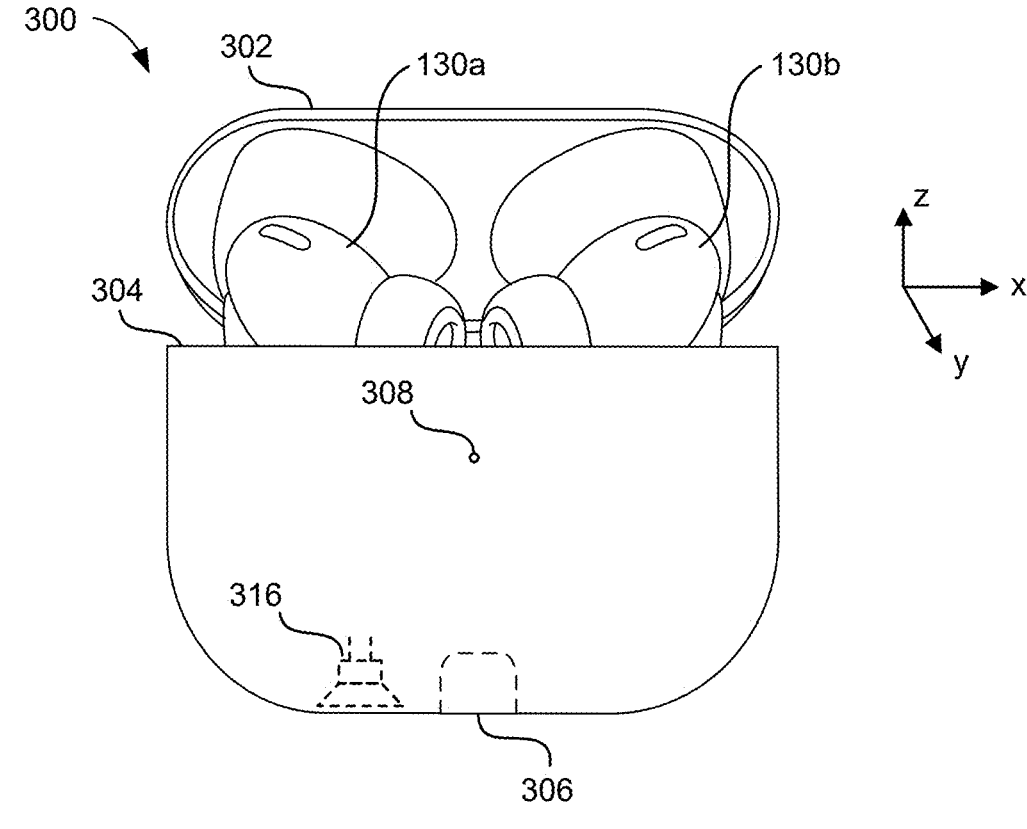
FIG. 3A
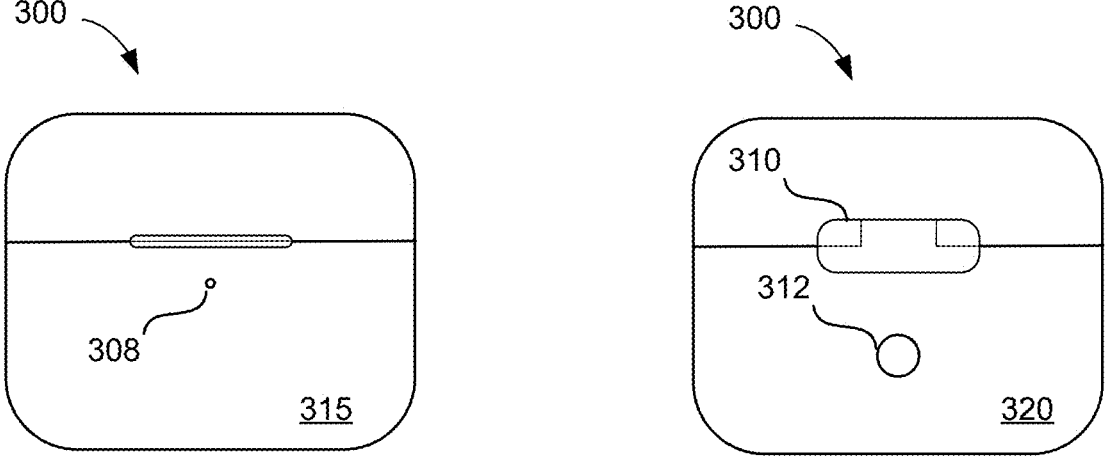
FIG. 3B          FIG. 3C

600

650

SYSTEM AND METHOD FOR ADJUSTING THE AUDIO VOLUME OF A CHARGING CASE

BACKGROUND

Portable earphone devices, such as headphones, can be used with a wide variety of electronic devices such as portable media players, smart phones, tablet computers, laptop computers, stereo systems, and other types of devices. Portable earphone devices have historically included one or more small speakers configured to be place on, in, or near a user's ear, structural components that hold the speakers in place, and a cable that electrically connects the portable earphone device to an audio source.

A growing trend has been the increased popularity of small, wireless headphones that fit within the ear of a user, referred to herein as "wireless earphones". Wireless earphones do not include a cable between the audio source and earphones and instead, wirelessly receive a stream of audio data from a wireless audio source.

Wireless earphones can be relatively small. While their size is an advantage in terms of portability and ease of use, their small size makes them easy to misplace or lose. Additionally, such wireless earphones require a battery to operate circuitry, including speakers and wireless circuitry, within the earphones.

To address these issues, many wireless earphones come with a charging case that both stores the earphones in a convenient location and can be used to charge the battery in the earphones. While the charging case is larger than the earphones itself, it too is relatively compact and can be easily misplaced.

Thus, while wireless earphones have many advantages over other wired headphones and have become a very popular with consumers, improvements to the user experience for such earphones are desirable.

SUMMARY

Embodiments described in this disclosure pertain to a storage and/or charging case for a portable electronic device. The charging case can include a speaker or similar device that can generate a sound, such as a beep or chime. The charging case can also include wireless communication circuitry that allows it to cooperate with a host device to generate sound from the speaker when requested, for example, when the charging case is temporarily lost or otherwise misplaced and a user instructs the host device to play a chime on the charging case to help locate the case. Depending on the situation, it can be beneficial to play the chime at different volumes. For example, in some situations, it can be beneficial to play the chime at the loudest possible volume without triggering an event that causes one or more hardware constraints associated with the charging case to shutdown or reset the charging case. In other situations, it can be beneficial to play the chime at a volume that depends, at least in part, on one or more external factors, such as such as ambient volume, location of the charging case or time of the day at which the chime or other sound is to be played.

Some embodiments disclosed herein pertain to methods and systems for controlling the volume of a speaker or similar audio device within a charging case. While some embodiments are particularly well suited to be implemented as a charging case for wireless earphones, embodiments are not so limited, and other embodiments pertain to a storage and/or charging case for other types of portable electronic devices that include a speaker or similar an audio device.

In some embodiments, an electronic device is disclosed. The electronic device can include: a controller; a rechargeable battery; a speaker; and circuitry coupled to the battery and the speaker. The circuitry can be configured to: initiate playing an audio asset on the speaker at a first gain level; while continuing to play the audio asset, increase the gain level of the speaker from the first gain level to a final gain level by repeating a sequence of measuring a system load on the battery and increasing the gain level of the speaker until the measured system load reaches a threshold level; and after the measured system load reaches the threshold level, set the gain level of the speaker at the final gain level and continuing playing the audio asset with the gain set at the final gain level. In some implementations, the the electronic device can be a storage case for a pair of wireless earphones.

In some embodiments a storage case for a portable electronic device is provided where the storage case includes: a housing defining a device storage area; a lid coupled to the housing and operable between a closed position in which the lid covers the device storage area and an open position in which the device storage area first and second pockets are exposed; a rechargeable battery; a speaker; and circuitry coupled to the battery and the speaker. The circuitry can be configured to: initiate playing an audio asset on the speaker at a first gain level; while continuing to play the audio asset, increase the gain level of the speaker from the first gain level to a final gain level by repeating a sequence of measuring a system load on the battery and increasing the gain level of the speaker until the measured system load reaches a threshold level; and after the measured system load reaches the threshold level, set the gain level of the speaker at the final gain level and continuing playing the audio asset with the gain set at the final gain level. In some implementations, the storage case can be configured to store first and second wireless earphones. And, in some implementations, the housing can include a peripheral wall that defines a shell and includes one or more audio openings formed through the peripheral wall, and the storage case can further include a frame insert, coupled to the housing, and extending into the shell. The frame insert can have one or more insert walls that define first and second pockets sized and shaped to accept first and second wireless earphones, respectively.

According to additional embodiments, a charging case for a pair of wireless earphones is provided in which the charging case includes: a housing having a peripheral wall that defines a shell and one or more audio openings formed through the peripheral wall; a frame insert coupled to the housing and extending into the shell, the frame insert having one or more insert walls that define first and second pockets sized and shaped to accept first and second wireless earphones, respectively; wherein the one or more insert walls cooperate with the housing peripheral wall to define a interior cavity within the charging case; a lid coupled to the housing and operable between a closed position in which the lid covers the first and second pockets and an open position in which the first and second pockets are exposed; a rechargeable battery disposed within the interior cavity; a speaker disposed within the interior cavity and aligned to emit sound through the one or more openings; and circuitry coupled to the rechargeable battery and the speaker. The circuitry can be configured to: (a) initiate playing an audio asset on the speaker at a first gain level; (b) while continuing to play the audio asset, increase the gain level of the speaker from the first gain level to a final gain level by repeating a sequence of (i) measuring a system load on the battery and (ii) increasing the gain level of the speaker, until the measured system load reaches a threshold level; and (c) after the measured system load reaches the threshold level, set the gain level of the speaker at the final gain level and continue playing the audio asset with the gain set at the final gain level.

In various implementations, a charging case or other electronic device according to embodiments disclosed herein can include one or more of the following features. The circuitry can include wireless communication circuitry operable to receive a lost mode command from a host device and a controller operable to respond to the lost mode command by playing the audio asset on the speaker. The circuitry can include an amplifier having an output coupled to the speaker and a microcontroller having an serial audio interface coupled to the amplifier. The circuitry can include a controller and a power management circuit configured to provide a battery under voltage lock out (UVLO) that initiates a reset of the controller if the voltage provided by the battery drops below a threshold voltage level. The threshold voltage level can be stored in the controller, and the circuitry can further include an audio clamping circuit having a comparator with a first input coupled to receive the threshold voltage level from the controller and a second input coupled to a voltage level of the battery. The circuitry can include a controller and a power management circuit configured to provide a battery overcurrent protection (OCP) feature that initiates a reset of the controller if a current level delivered by the battery to the speaker raises above a threshold current level. The threshold current can be stored in the controller. The circuitry can further include an amplifier coupled at an output to the speaker, and an audio clamping circuit comprising a comparator having a first input coupled to receive the threshold current level from the controller and a second input coupled to the output of the amplifier.

Additionally, in various implementations, the circuitry can determine a voltage level provided by the battery and determine if the measured load reaches the threshold level by comparing the voltage provided by the battery to a threshold voltage level. The circuitry can determine a current level provided by the battery and can determine if the measured load reaches the threshold level by comparing the current level provided by the battery to a threshold current level. The charging case or other electronic device can further include a memory that stores the audio asset. The circuitry can include wireless communication circuitry operable to receive a lost mode command from a host device and a controller operable to respond to the lost mode command by playing the audio asset on the speaker. The memory can be an external memory that stores a plurality of audio assets and the controller can be operable to select one of the plurality of audio assets from the external memory to load into a memory of the controller. The circuitry can be configured to store a plurality of audio assets. The step of initiating playing an audio asset on the speaker at a first gain level can play a first audio asset in the plurality of assets in response to the charging case receiving a first command instruction. The circuitry can be further configured to play a second audio asset, different than the first audio asset, in response to receiving a second command instruction, different than the first command instruction. The circuitry can be further configured to, when playing the second audio asset, set the gain of the speaker to a level that is determined based on an environmental condition external to the charging case. The environmental condition external to the charging case can be one of an ambient volume, a location of the charging case or a time of day.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIGS. 3A and 3B are simplified front plan views of an earphone charging case according to some embodiments;

FIG. 3C is a simplified rear plan view of the earphone charging case depicted in FIGS. 3A and 3B in accordance with some embodiments;

DETAILED DESCRIPTION

Definitions

Figure 1:
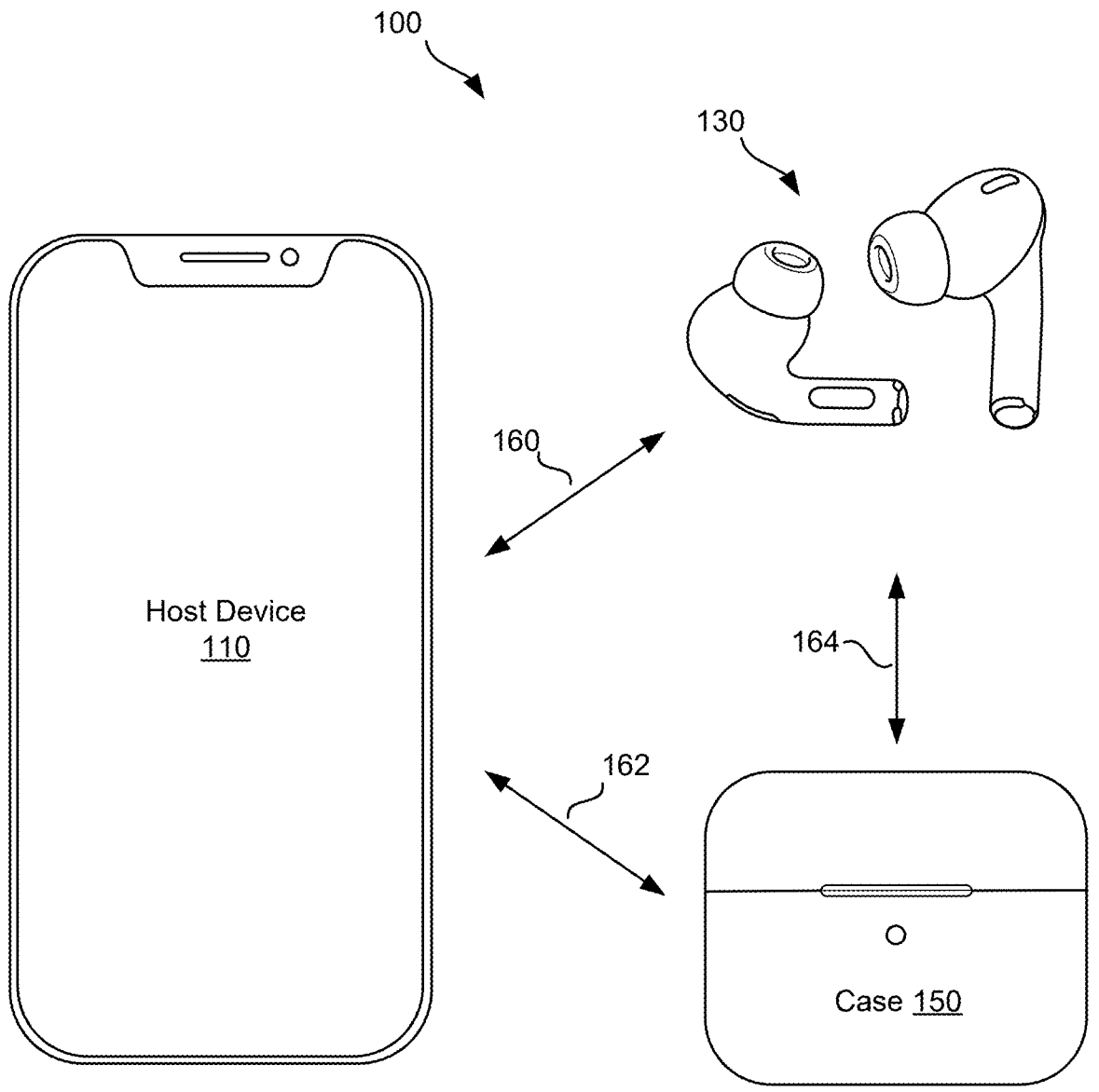
FIG. 1 is a simplified illustration of an exemplary wireless earphone system having a host device configured as a smart phone, a portable charging case, and a pair of wireless earphones according to some embodiments.

As used herein, the term "portable electronic device" includes any electronic device that runs on battery power and has a relatively small form factor enabling the device to be easily carried by a person. A portable case for storing and charging wireless earphones is one type of portable electronic device.

The term "portable listening device" includes any portable device configured to be worn by a user and placed such that a speaker of the portable listening device is adjacent to or in a user's ear. A "portable wireless listening device" is a portable listening device that is able to receive and/or send streams of audio data from or to a second device without a wire connecting the portable wireless listening device to the second device using, for example, a wireless communication protocol.

Headphones are one type of portable listening device, headsets (a combination of a headphone and an attached microphone) are another, and hearing aids (in-ear devices that are designed to augment sounds from the surrounding environment to improve a user's hearing) are still an additional type of portable listening device. The term "headphones" represents a pair of small, portable listening devices that are designed to be worn on or around a user's head. They convert an electrical signal to a corresponding sound that can be heard by the user. Headphones include traditional headphones that are worn over a user's head and include left and right earcups connected to each other by a headband, and earphones (very small headphones that are designed to be fitted directly in a user's ear). Traditional headphones include both over-ear headphones (sometimes referred to as either circumaural or full-size headphones) that have earpads that fully encompass a user's ears, and on-ear headphones (sometimes referred to as supra-aural headphones) that have earpads that press against a user's ear instead of surrounding the ear.

Earphones, which are a type of headphones, are also portable listening devices. The term "earphones", which can also be referred to as ear-fitting headphones, includes both small headphones, sometimes referred to as "earbuds", that fit within a user's outer ear facing the ear canal without being inserted into the ear canal, and in-ear headphones, sometimes referred to as canal phones, that are inserted in the ear canal itself. The term "earbuds", however, is not used consistently within the industry, and is often used to represent any type headphone that fits within a user's ear. Thus, as used herein, the terms "earbuds" and "earphones" are used interchangeably and can refer to both earphones that are inserted into the ear canal as well as earphones that face the ear canal without being inserted therein.

As used herein, the term "eartip", which can also be referred to as earmold, includes pre-formed, post-formed, or custom-molded sound-directing structures that at least partially fit within an ear canal. Eartips can be formed to have a comfortable fit capable of being worn for long periods of time. They can have different sizes and shapes to achieve a better seal with a user's ear canal and/or ear cavity.

A "speaker" is a device the converts electrical impulses into an audible sound. Some speakers can produce a range of different tones and can thus be used to play music or other complex sound sequences. Other speakers, however, can be designed to generate just a single note or sound (or a small number of notes and sounds) that can be repeated for alerts or for signaling.

A "storage case" for a portable electronic device is a structure that the portable electronic device can be stored in. And, a "portable storage case" is a storage case that is itself portable, i.e., has a relatively small form factor that enables the portable storage case to be easily carried by a person. A charging case for a portable electronic device is a storage case that includes a battery that can be charge the portable electronic device when it is stored in the charging case.

Disclosed Embodiments

Various embodiments described herein pertain to a storage and/or charging case for a portable electronic device. The charging case can include a speaker or similar device that can generate a sound, such as a beep or chime, and can also include wireless communication circuitry that allows the charging case to cooperate with a host device to generate sound from the speaker when requested, for example, when the charging case is temporarily lost or otherwise misplaced and a user instructs the host device to play a chime on the charging case to help locate the case. Depending on the situation, it can be beneficial to play the chime at different volumes. For example, in some situations, it can be beneficial to play the chime at the loudest possible volume without triggering an event that causes one or more hardware constraints associated with the charging case to shutdown or reset the charging case. In other situations, it can be beneficial to play the chime at a volume that depends, at least in part, on one or more external factors, such as such as ambient volume, location of the charging case or time of the day at which the chime or other sound is to be played.

Embodiments disclosed herein pertain to methods and systems for controlling the volume of a speaker or similar audio device within a charging case. While some embodiments are particularly well suited to be implemented as a charging case for wireless earphones, embodiments are not so limited, and other embodiments pertain to a storage and/or charging case for other types of portable electronic devices that include a speaker or similar an audio device.

In order to better understand and appreciate earphones according to embodiments described herein, a brief description of a use case for such earphones is provided below with respect to FIG. 1.

Example Wireless Listening System

FIG. 1 is an example of a wireless listening system 100 according to some embodiments. System 100 can include a host device 110, a pair of portable wireless listening devices 130 and a charging case 150. Host device 110 is depicted in FIG. 1 as a smart phone but can be any electronic device that can transmit audio data to portable listening device 130. Other, non-limiting examples of suitable host devices 110 include a laptop computer, a desktop computer, a tablet computer, a smart watch, an audio system, a video player, a television, and the like.

As depicted graphically in FIG. 1, host device 110 can be wirelessly communicatively coupled with portable wireless listening devices 130 and charging case 150 through wireless communication links 160 and 162. Similarly, portable wireless listening devices 130 can be communicatively coupled to charging case 150 via wireless communication link 164. Each of the wireless communication links 160, 162 and 164 can be a known and established wireless communication protocol, such as a Bluetooth protocol, a WiFi protocol, or any other acceptable protocol that enables electronic devices to wirelessly communicate with each other. Thus, host device 110 can exchange data directly with portable wireless listening devices 130, such as audio data, that can be transmitted over wireless link 160 to wireless listening devices 130 for play back to a user, and audio data that can be received by host device 110 as recorded/inputted from microphones in the portable wireless listening devices 130. In some implementations, host device 110 can also be wirelessly communicatively coupled with charging case 150 via wireless link 162 so that the host device 110 can exchange data with the charging case, such as data indicating the battery charge level data for case 150, data indicating the battery charge level for portable wireless listening devices 130, data indicating the pairing status of portable wireless listening devices 130.

Portable wireless listening devices 130 can be stored within case 150, which can protect the devices 130 from being lost and/or damaged when they are not in use and can also provide power to recharge the batteries of portable wireless listening devices 130 as discussed below. In some embodiments portable wireless listening devices 130 can also be wirelessly communicatively coupled with charging case 150 via wireless link 164 so that, when the devices are worn by a user, audio data from case 150 can be transmitted to portable wireless listening devices 130. As an example, charging case 150 can be coupled to an audio source different than host device 110 via a physical connection, e.g., an auxiliary cable connection. The audio data from the audio source can be received by charging case 150, which can then wirelessly transmit the data to wireless listening devices 130. That way, a user can hear audio stored on or generated by an audio source by way of wireless listening devices 130 even though the audio source does not have wireless audio output capabilities.

As will be appreciated herein, portable wireless listening devices 130 can include several features can enable the devices to be comfortably worn by a user for extended periods of time and even all day. Each portable listening device 130 can be shaped and sized to fit securely between the tragus and anti-tragus of a user's ear so that the portable listening device is not prone to falling out of the ear even when a user is exercising or otherwise actively moving. Its functionality can also enable wireless listening devices 130 to provide an audio interface to host device 110 so that the user may not need to utilize a graphical interface of host device 110. In other words, wireless listening devices 130 can be sufficiently sophisticated that they can enable the user to perform day-to-day operations from host device 110 solely through interactions with wireless listening devices 130. This can create further independence from host device 110 by not requiring the user to physically interact with, and/or look at the display screen of, host device 110, especially when the functionality of wireless listening devices 130 is combined with the voice control capabilities of host device 110. Thus, wireless listening devices 130 can enable a true hands free experience for the user.

Figure 2:
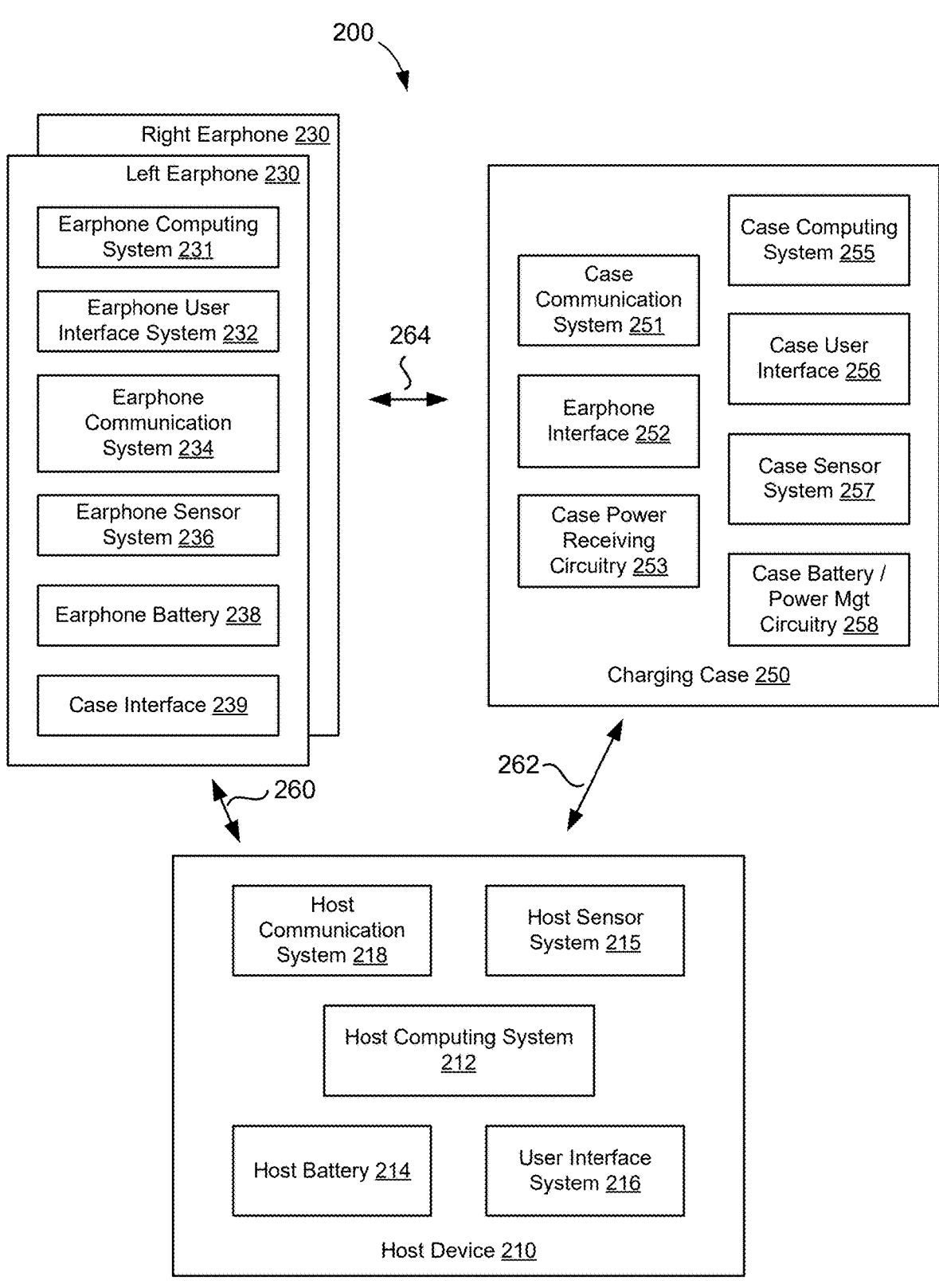
FIG. 2 is a simplified block diagram of various components of a wireless earphone system according to some embodiments.

Details of an example earphone, which can be representative of each of the portable wireless listening devices 130 are discussed below. First, however, reference is made to FIG. 2, which is a simplified block diagram of various components of a wireless listening system 200 according to some embodiments that includes a host device 210, a pair of portable wireless listening devices (PWLDs) 230 (e.g., a right PWLD 230 and a left PWLD 230) and a charging case 250. System 200 can be representative of system 100 shown in FIG. 1 and host device 210, portable wireless listening devices 230 and charging case 250 can be representative of host device 110, portable wireless listening devices 130 and charging case 150, respectively. Each portable wireless listening device 230 can receive and generate sound to provide an enhanced user interface for host device 210. For convenience, the discussion below refers to a single portable wireless listening device 230, but it is to be understood that, in some embodiments, a pair of portable listening devices can cooperate together for use in a user's left and right ears, respectively, and each portable wireless listening device in the pair can include the same or similar components.

Portable wireless listening device 230 can include a computing system 231 that executes computer-readable instructions stored in a memory bank (not shown) for performing a plurality of functions for portable wireless listening device 230. Computing system 231 can be one or more suitable computing devices, such as microprocessors, computer processing units (CPUs), digital signal processing units (DSPs), field programmable gate arrays (FPGAs), application specific integrated circuits (ASICs) and the like.

Computing system 231 can be operatively coupled to a user interface system 232, communication system 234, and a sensor system 236 for enabling portable wireless listening device 230 to perform one or more functions. For instance, user interface system 232 can include a driver (e.g., speaker) for outputting sound to a user, one or more microphones for inputting sound from the environment or the user, one or more LEDs for providing visual notifications to a user, a pressure sensor or a touch sensor (e.g., a resistive or capacitive touch sensor) for receiving user input, and/or any other suitable input or output device. Communication system 234 can include wireless and wired communication components for enabling portable wireless listening device 230 to send and receive data/commands from host device 210. For example, in some embodiments communication system 234 can include circuitry that enables portable wireless listening device 230 to communicate with host device 210 over wireless link 260 via a Bluetooth or other wireless communication protocol. In some embodiments communication system 234 can also enable portable wireless listening device 230 to wirelessly communicate with charging case 250 via wireless link 264. Sensor system 236 can include proximity sensors (e.g., optical sensors, capacitive sensors, radar, etc.), accelerometers, microphones, and any other type of sensor that can measure a parameter of an external entity and/or environment.

Portable wireless listening device 230 can also include a battery 238, which can be any suitable energy storage device, such as a lithium ion battery, capable of storing energy and discharging stored energy to operate portable wireless listening device 230. The discharged energy can be used to power the electrical components of portable wireless listening device 230. In some embodiments, battery 238 can be a rechargeable battery that enables the battery to be repeatedly charged as needed to replenish its stored energy. For instance, battery 238 can be coupled to battery charging circuitry (not shown) that is operatively coupled to receive power from charging case interface 239. Case interface 239 can, in turn, electrically couple with earphone interface 252 of charging case 250. In some embodiments, power can be received by portable wireless listening device 230 from charging case 250 via electrical contacts within case interface 239. In some embodiments, power can be wirelessly received by portable wireless listening device 230 via a wireless power receiving coil within case interface 239.

Charging case 250 can include a battery and power management circuit 258. Battery and power management circuit 258 can store and discharge energy to provide power to operate the various circuitry and components within charging case 250 and to recharge the battery 238 of portable wireless power listening device 230. As mentioned above, in some embodiments circuitry within earphone interface 252 can transfer power to portable wireless listening device 230 through a wired electrical connection between contacts in charging case 250 that are electrically coupled to contacts in portable wireless listening device 250 to charge battery 238. While case 250 can be a device that provides power to charge battery 238 through a wired interface with device 230 in some embodiments, in other embodiments case 250 can provide power to charge battery 238 through a wireless power transfer mechanism instead of or in addition to a wired connection. For example, earphone interface can include a wireless power transmitter coil that can couple with a wireless power receiving coil within portable wireless listening device 230.

In addition to providing power to portable wireless listening device 230, charging case 250 can also receive power from an external power source via power receiving circuitry 253. Case power receiving circuitry 253 can include a wired and/or a wireless power receiving interface. For example, in some embodiments, charging case 250 can include a receptacle connector (e.g., a USB-C or a lightning connector) that enables an external energy source to be directly connected to the charging case to charge battery 258 or to be connected to the charging case via an appropriate power adapter. And, in some embodiments, charging case 250 can include a wireless power receiving coil that can wirelessly receive power from a corresponding wireless power transmitter coil in a power supply external to the charging case.

Charging case 250 can also include a case computing system 255 and a case communication system 251. Case computing system 255 can be one or more processors, ASICS, FPGAs, microprocessors, and the like for operating case 250. Case computing system 255 can be coupled to earphone interface 252 and can control the charging function of case 250 to recharge batteries 238 of the portable wireless listening devices 230, and case computing system 255 can also be coupled to case communication system 251 for operating the interactive functionalities of case 250 with other devices, including portable wireless listening device 230. In some embodiments, case communication system 251 includes a Bluetooth component, or any other suitable wireless communication component, that wirelessly sends and receives data with communication system 234 of portable wireless listening device 230. Towards this end, each of charging case 250 and portable wireless listening device 230 can include an antenna formed of a conductive body to send and receive such signals.

Case 250 can also include a user interface 256 that can be is operatively coupled to case computing system 255 to alert a user of various notifications and a sensor system 257. For example, the user interface can include a speaker that can emit audible noise capable of being heard by a user, one or more LEDs or similar lights that can emit a light that can be seen by a user (e.g., to indicate whether the portable listening devices 230 are being charged by case 250 or to indicate whether case battery 258 is low on energy or being charged), and/or one or more buttons or other devices that can depressed or otherwise selected or activated to initiate features of charging case 250. Sensor system 257 can include optical sensors, accelerometers, microphones, and other types of sensors that can measure a parameter of an external entity and/or environment in which the charging case is present.

Host device 210, to which portable wireless listening device 230 is an accessory, can be a portable electronic device, such as a smart phone, tablet, or laptop computer. Host device 210 can include a host computing system 212 coupled to a battery 214 and a host memory bank 134 containing lines of code executable by host computing system 212 for operating host device 210. Host device 210 can also include a host sensor system 215, e.g., accelerometer, gyroscope, light sensor, and the like, for allowing host device 210 to sense the environment, and a host user interface system 216, e.g., display, speaker, buttons, touch screen, and the like, for outputting information to and receiving input from a user. Additionally, host device 210 can also include a host communication system 218 for allowing host device 210 to send and/or receive data from the Internet or cell towers via wireless communication, e.g., wireless fidelity (WiFi), long term evolution (LTE), code division multiple access (CDMA), global system for mobiles (GSM), Bluetooth, and the like. In some embodiments, host communication system 218 can also communicate with communication system 234 in portable wireless listening device 230 via a wireless communication link 262 so that host device 210 can send audio data to portable wireless listening device 230 to output sound, and receive data from portable wireless listening device 230 to receive user inputs. The communication link 262 can be any suitable wireless communication line such as Bluetooth connection.

By enabling communication between host device 210 and portable wireless listening device 230, wireless listening device 230 can enhance the user interface of host device 210.

Charging Case

Some embodiments described herein pertain to a charging case that can store and charge a portable electronic device, such as a wireless listening device or a pair of wireless earphones, such as a pair of earphones 130. The charging case can protect the portable electronic device or wireless listening devices from physical damage as well as provide a source of power for charging the electronic device or pair of wireless listening devices.

FIGS. 3A-3C are simplified plan views of a charging case 300 that can store a pair of earbuds, such as earphones 130, according to some embodiments of the present disclosure. As shown in each of FIGS. 3A-3C, case 300 can include a lid 302 and a body 304 that forms an internal cavity for housing a pair of wireless earphones 130a, 130b that can be worn in a user's left and right ears, respectively. FIGS. 3A and 3B are front plan views of charging case 300 and FIG. 3C is a rear plan view of the charging case. Charging case 300 is depicted in FIG. 3A with lid 302 in an open position while FIGS. 3B and 3C depict the charging case with the lid in a closed position. Lid 302 can be attached to body 304 by a hinge 310 (shown in FIG. 3C) that enables the lid to be moved between an open position (in which the earphones 130a, 130b can be inserted into or removed from case 300) and a closed position (in which the lid 302 covers the earphones 130a, 130b thereby completely enclosing the earbuds within the charging case 300).

In some embodiments, charging case 300 can include an internal frame (not visible in any of FIGS. 3A-3C) including portions designed to provide contours and surface features against which wireless listening devices 130a, 130b can rest in strategic positions discussed herein to minimize the size of case 300.

To minimize the overall size of charging case 300, earphones 130a, 130b can be positioned at strategic angles when placed in case 300. In some embodiments, each stem of the earphones 130a, 130b is positioned at an angle with respect to two axis: an x-axis and a y-axis, instead of being positioned substantially vertically within the charging case. For purposes of description, the x-axis runs between earphones 130a, 130b, the y-axis runs between the front and the back of charging case 300, and the z-axis runs between the bottom of body 304 and the top of lid 302.

Case 300 can be configured to charge wireless listening devices 130a, 130b when they are housed in case 300. Towards this end, in some embodiments case 300 can include two pairs of electrical contacts (not visible in FIGS. 3A-3C) for making electrical contact with respective contacts on the stems of each earbud so that charge can flow from an internal battery (not shown) of case 300 to internal batteries of the earphones 130a, 130b. The charging case internal battery (not shown in FIGS. 3A-3C, but shown in FIG. 2 as battery 258) can be charged by an external power supply that is electrically coupled to case 300 via a connector 306 (shown only in FIG. 3A for ease of illustration). Connector 306 can be any appropriate physical connector interface, such as a lightning connector port developed by Apple, a USB-C port, a mini USB port or the like. In some embodiments charging case 300 also includes a wireless power receiving coil (not shown) to wirelessly receive power that can be used to charge the internal battery.

In some embodiments charging case 300 is highly resistant to moisture ingression and can be designed to meet IPX4 water resistance standards. Towards this end, electrical components within case 300 (e.g., the charging case battery, the circuit board on which the processor and other electronic circuitry that controls the operation of the charging case, etc.) can be sealed within an internal system volume that is sealed with external system seals. Additionally, each electrical component can be sealed individually with a conformal coating or adhesive. Some embodiments can further include a barometric vent within the connector 306 module that is permeable to air but not liquids. The barometric vent allows charging case 300 to be tested, in the manufacturing line, immediately after manufacture of the case is completed to determine if the charging case is fully sealed in accordance with the manufacturer expectations, for example, in accordance with the IPX4 requirements.

Case 300 can further include a visual indicator 308, one or more input buttons 312 and a speaker 316 (sometimes referred to herein as an "audio driver"). In some embodiments, visual indicator 308 can be configured to emit different colors of light depending on the charge status of the case. As an example, indicator 308 can emit green light when the case is charged, emit orange light when the charging case battery is charging and/or when the charging case battery has less than a full charge, and red light when the charging case battery is depleted. When viewed from outside of case 300, visual indicator 308 can have a circular shape, or any other suitable shape, such as square-like, rectangular, oval, and the like.

Input button 312 allows a user to interact and control various features of charging case 300. For example, if input button 312 is depressed when the earbuds are stored within case 300 with lid 302 open, the activation of the input button can initiate a pairing routine that allows the earbuds to be paired with a host device. While indicator 308 and button 312 are shown in FIGS. 3B and 3C on front and rear case surfaces 315 and 320, respectively, embodiments are not limited to any particular location for such user interfaces and these and other user interfaces can be positioned at any suitable exterior or interior surface of charging case 300.

Speaker 316 can be positioned within an internal cavity of the charging case defined by the housing and/or an internal frame and can output audible sound through one or more openings (not shown) in the housing. Speaker 316 can generate a sound, such as a beep or chime that can provide information or signals to a user. For example, charging case 300 can wirelessly receive a command from a host device (e.g., via case communication system 251) to play a chime or other sound with speaker 316 when charging case 300 is temporarily lost or otherwise misplaced to make it easier for someone to locate the case. Visual indicator 308, button 312 and speaker 316 can all be part of user interface 256 discussed above with respect to FIG. 2.

Figure 3D:
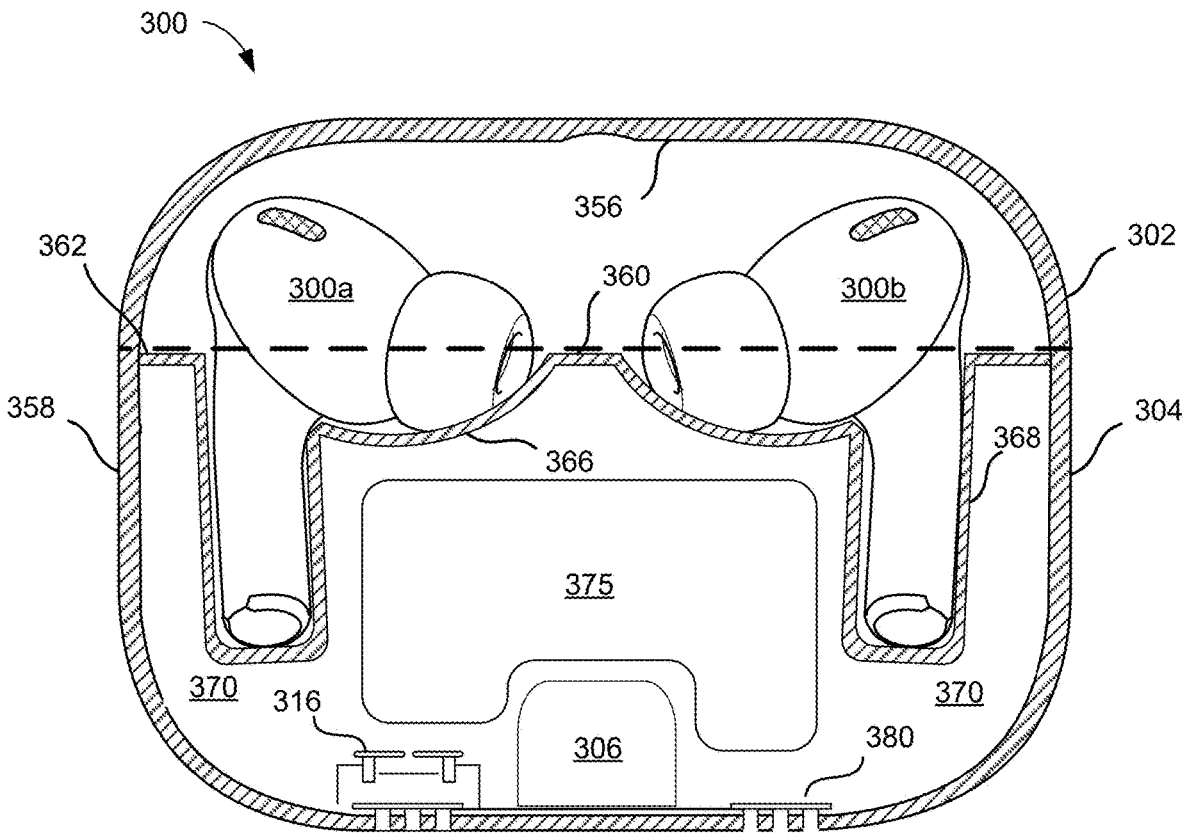
FIG. 3D is a simplified cross-sectional illustration of the earphone charging case depicted in FIGS. 3A-3C according to some embodiments.

FIG. 3D is a simplified cross-sectional illustration of earphone charging case 300 according to some embodiments. As shown, charging case 300 is depicted with lid 302 in a closed position over body 304. In some embodiments, each of lid 302 and body 304 can be hollow shells formed from a single continuous wall. For example, lid 302 can include a peripheral wall 356 that defines both exterior and interior surfaces of the lid, while body 304 can includes a peripheral wall 358 that defines both exterior and interior surfaces of the body. A frame insert 360 can fit within the peripheral wall 358 and can include an insert wall 362 that defines one or more cavities pockets for housing a pair of earphones, such as left and right earphones 300a and 300b or any of the earphones disclosed herein. As an example, in charging case 300 frame insert 360 can include a peripheral wall 1812 that defines contoured cavities 366 and 348 sized and shaped to accept a lower portion of earphones 300a, 300b.

Frame insert 360 can cooperate with peripheral wall 358 to form a waterproof, sealed chamber 370 within body 304 in which various internal components of the charging case can be positioned. For example, charging case 300 can also include circuitry 375 mounted to one or more circuit boards, an antenna (not shown) and a speaker module 316 within the sealed chamber 370. Circuitry 375, antenna 1822 and other components can be formed on a common support substrate, such as a printed circuit board (PCB), or multiple, separate substrates coupled together by flex circuits or other connectors. Circuitry 375 can include a wireless communication circuitry and a controller mounted on the PCB, along with any or all of the other circuitry and electronic subsystems that control various functions of charging case 300, such as the circuitry that implements function blocks 251-258 shown in FIG. 2.

In some embodiments, speaker 316 can generate a relatively loud beeping sound noise to assist as part of the Find My Device routine (or similar location-based find technique) and charging case 300 can include a B-vent module 380 to help ensure that air pressure within the speaker 316 is equalized to the air pressure external to charging case 300 in order for speaker module 316 to function properly.

Figure 4:
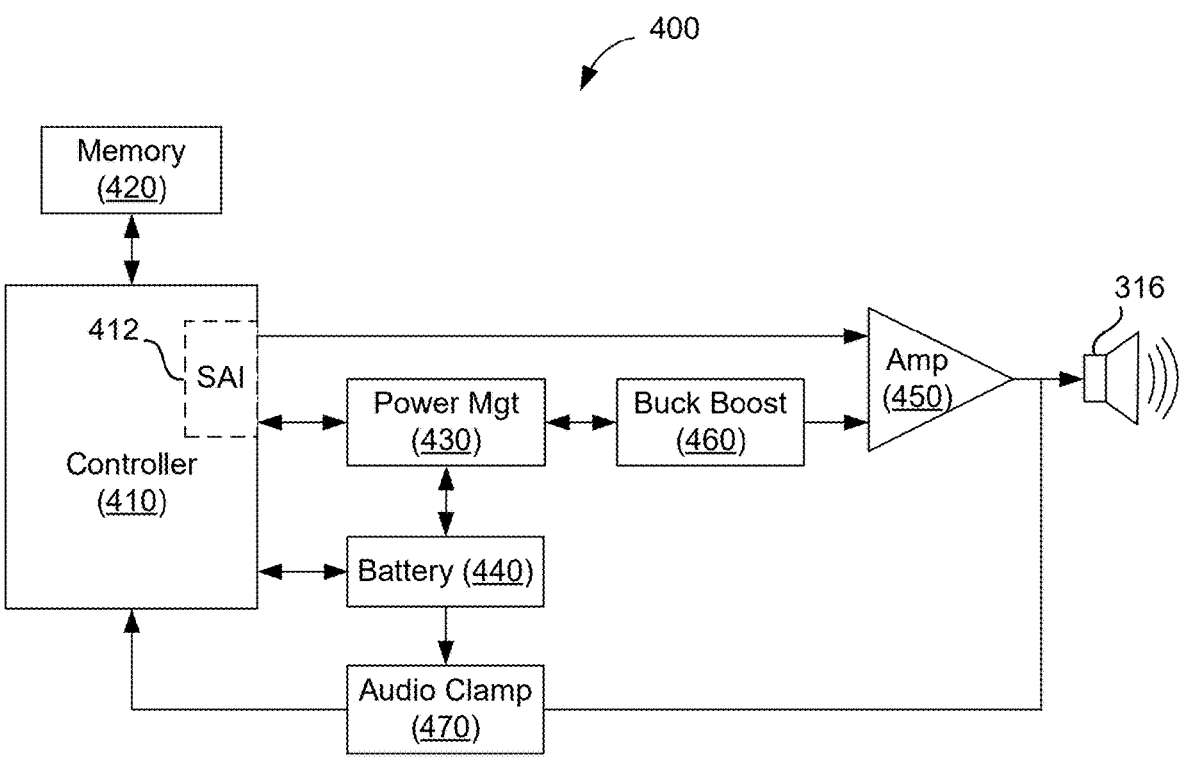
FIG. 4 is a simplified schematic view of circuitry 400 within a charging case according to some embodiments.

Reference is now made to FIG. 4, which is a simplified schematic view of circuitry 400 within charging case 300 according to some embodiments. As shown, circuitry 400 can be representative of a subset of circuitry 375 (shown in FIG. 3D) and can include, among other elements, a controller 410, a memory 420, power management circuit 430 and a battery 440. Controller 410 can be a microcontroller, an ASIC or multiple chips and circuits that control the overall operation of electronic circuitry within charging case 300. In the depicted embodiment, controller 410 can include a serial audio interface 412 that drives speaker 316. Memory 420 can be an external memory that stores various audio clips (assets) that can be loaded into controller 400 and sent through serial audio interface 412 to speaker 316. In some embodiments, memory 420 can store separate audio assets to be played on speaker 316 when different operational features of the charging case are activated. For example, charging case 300 can play one type of chime when connected to a charging source, a different chime when activated to pairing mode, and still a different chime in a lost mode and memory 420 can store the audio data for each of those different audio assets (different chimes). When a particular chime is needed, controller 410 can fetch the appropriate audio asset from memory 420 and store it within an internal memory of the controller. In other embodiments, all audio assets can be stored in an internal memory of controller 410 and memory 420 is not required to store audio assets.

Power management circuit 430 can be operatively coupled to a battery 440 through the controller 410 to provide power to operate electronic components within charging case 300, including speaker 316. Together, battery 440 and power management circuit 430 can be representative of battery and power management circuit 253 shown in FIG. 2.

In addition to providing power to various components within charging case 300, power management circuit 430 can also detect potential brownout conditions within the system and initiate a system reset when a brownout occurs. For example, in some embodiments, power management circuit 430 can provide a battery under voltage lock out (UVLO) feature in which, if the voltage provided by the battery drops below a minimum level (e.g., the operational voltage of the system), a brownout condition is initiated. As another example, in some embodiments, power management circuit 430 can also provide a battery overcurrent protection (OCP) feature in which, if the current supplied from battery 440 is above a maximum acceptable level, a brownout condition is initiated. The threshold levels that determine a brownout condition can vary based on the age and/or charge level of the battery as well as various operating conditions, such as battery temperature, ambient temperature, system load (earbud charging) among others. In some embodiments power management circuit 430 can provide both UVLO and OCP protection and/or protection against other potential brownout conditions.

Circuitry 400 also includes an amplifier 450 that can be directly coupled to speaker 316 and a buck boost circuit 460 coupled to an input of amplifier 450. Buck boost circuit 460 can include a transformer that adjusts the voltage provided to amplifier 450. Amplifier 450 can take digital audio signal output from controller 410, decode it into an analog signal, amplify the signal, and provide the amplified analog audio signal as an input to speaker 316.

Some embodiments disclosed herein can further include an audio clamping circuit 470 that can limit the volume at which speaker 316 is played during a lost mode operation in order to prevent speaker 316 from triggering a brownout condition. For example, audio clamping circuit 470 can ensure that the voltage level provided by battery 440 does not drop below the minimum voltage level at which power management circuit 430 initiates a brownout and/or can ensure that the current level provided by amplifier 450 to drive the speaker 316 is not above a maximum current level at which the power management circuitry 430 will also initiation a brownout. Further details on operation of an embodiment of audio clamping circuit 470 are described below in conjunction with FIGS. 5, 6A, 6B, and 7.

Find My Device

Charging case 300 can be relatively small (e.g., less than 2½ inches long, less than 2 inches high and less than 1 inch deep), which enables a user to easily take the case wherever he or she goes. With charging case 300 being so portable, it can also become misplaced. While not shown in any of FIGS. 3A-3C or 4, charging case 300 can also include circuitry and an antenna that enables the charging case to wirelessly communicate with and/or receive operational commands from other devices. The circuitry (e.g., circuitry 375 shown in FIG. 3D) can enable charging case 300 to wirelessly send out a secure signal (e.g., a Bluetooth signal) that can be detected by nearby devices in a location-based finding scheme, such as Find My Device developed by Apple, Inc. The nearby devices can then send the location of charging case 300 to an iCloud or similar server via a wireless network (e.g., a cellular or WiFi network). The server can then make the approximate location of charging case 300 visible to approved devices which can then display the location of charging case 300 on a map. The approved devices can also communicate with charging case 300 via the various wireless networks to send a signal to the circuitry in the charging case to put charging case 300 in a lost mode. After receiving such a signal, circuitry within charging case 300 (e.g., controller 410) can initiate a process that plays a chime or other sound through speaker 316 to help a user locate the charging case.

Maximizing Chime Volume

It can be helpful for a "lost mode" feature, such as that described above, to play the chime or other sound generated by speaker 316 at the loudest possible volume. When doing such, however, different hardware constraints of the electronic circuitry within charging case 300 might be reached. For example, as described above, in some embodiments charging case 300 can include power management circuit 430 that initiates a system reset if the battery voltage level dips too low or if battery current exceeds a maximum acceptable level. If playing the speaker at the loudest possible volume results in the battery voltage or battery current getting outside of certain threshold limits, power management circuit 430 can initiate a brownout that resets charging case 300 in order to protect circuitry within charging case 300. Initiating such a reset, however, would interrupt the lost mode feature and make it more difficult for a user to find a lost or misplaced charging case.

In order to ensure that activating speaker 316 during a lost mode operation does not cause a brownout, some embodiments include an audio clamping circuit (shown in FIG. 4 as audio clamping circuit 470) that can limit the volume at which speaker 316 is played during a lost mode operation. In some embodiments, controller 410 and audio clamping circuit 470 can implement a dynamic audio throttling process to set the volume of speaker 316 when charging case 300 is in a lost mode operation. The audio throttling process can do a live/in-system measurement to understand battery conditions, and then play speaker 316 at the maximum possible loudness. Embodiments can achieve this without any user impact or delays (i.e., a user will not notice the process in normal use) by quickly ramping up the gain of the speaker from an initial level to a maximum level, and calculate the trip points for brownout protection features, such as the UVLO and OCP features described above. The final gain can then be set accounting for the calculated trip points.

In one particular embodiment described below, speaker volume is ramped up and trip points for UVLO and OCP brownout protection features are calculated using two comparators. To better understand such an embodiment, reference is made to FIGS. 5, 6A, and 6B and in which FIG. 5 is a simplified flowchart depicting step associated with a method 500 according to some embodiments, FIG. 6A is a simplified schematic diagram of a circuit 600 that can determine the trip point for a UVLO brownout protection feature according to some embodiments, and FIG. 6B is a schematic diagram of a circuit 650 that can determine the trip point for a OCP brownout protection feature according to some embodiments.

Figure 5:
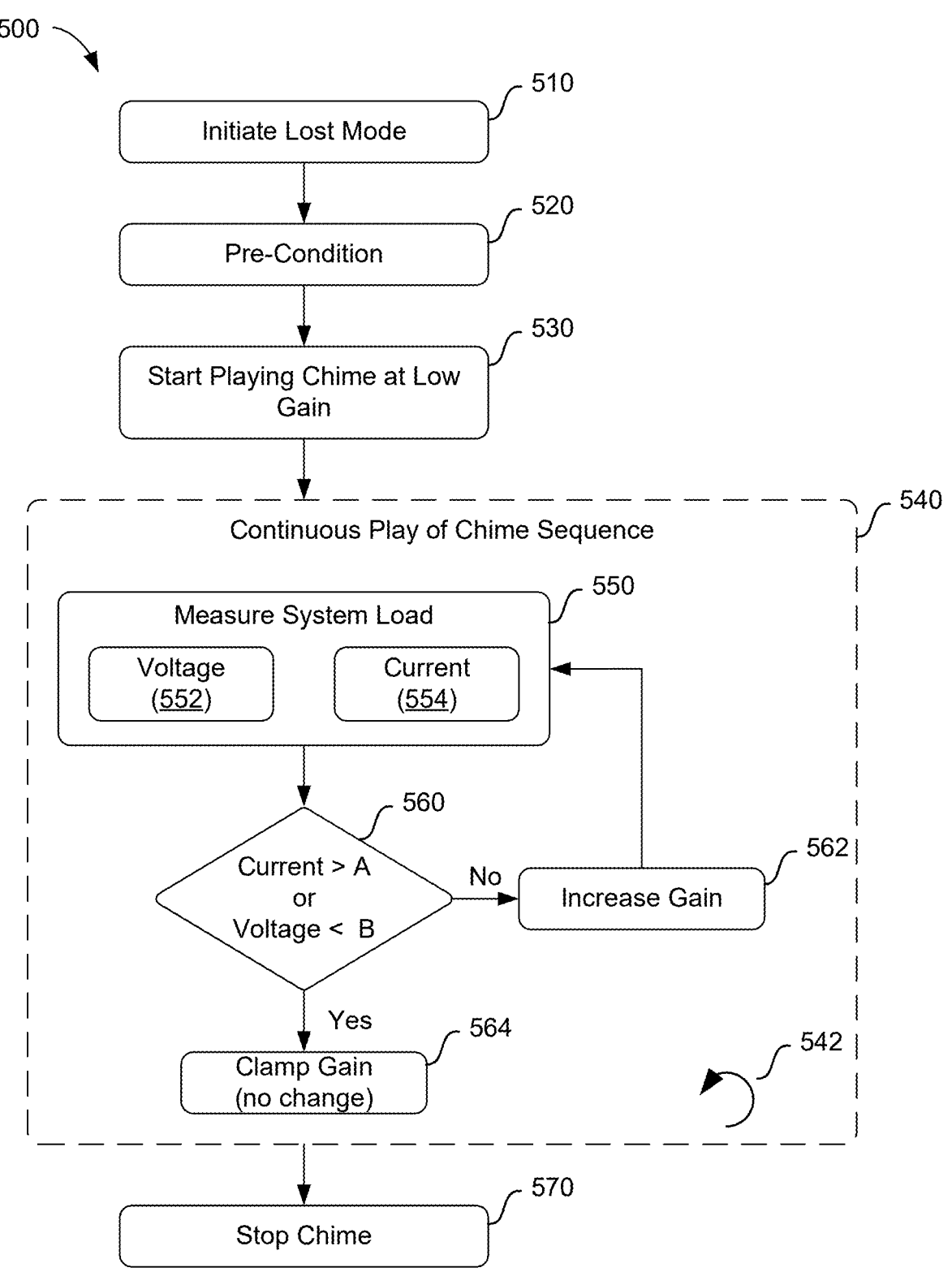
FIG. 5 is a simplified flowchart depicting step associated with a method according to some embodiments.
Figure 6A:
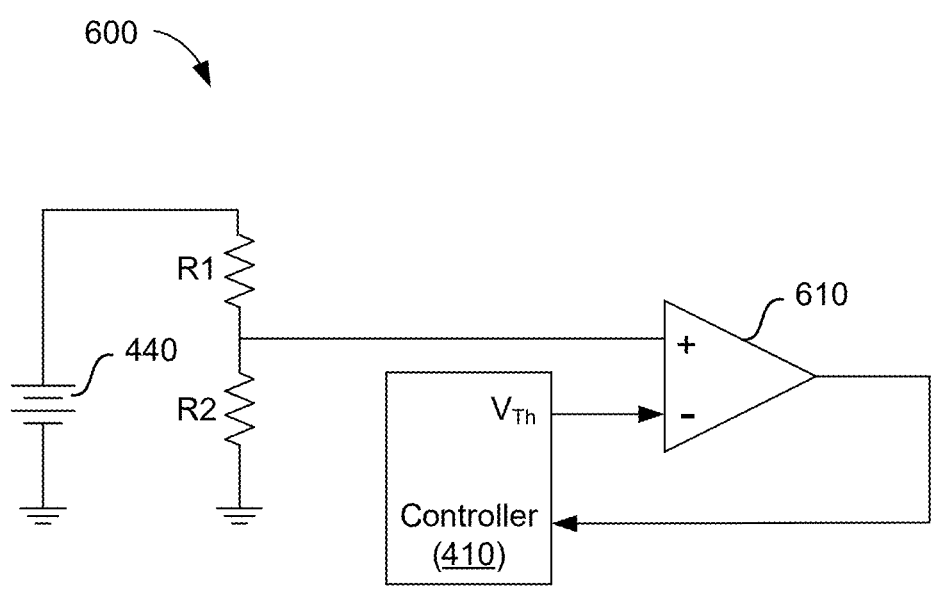
FIG. 6A is a simplified schematic diagram of a circuit that can determine the trip point for a UVLO brownout protection feature according to some embodiments.
Figure 6B:
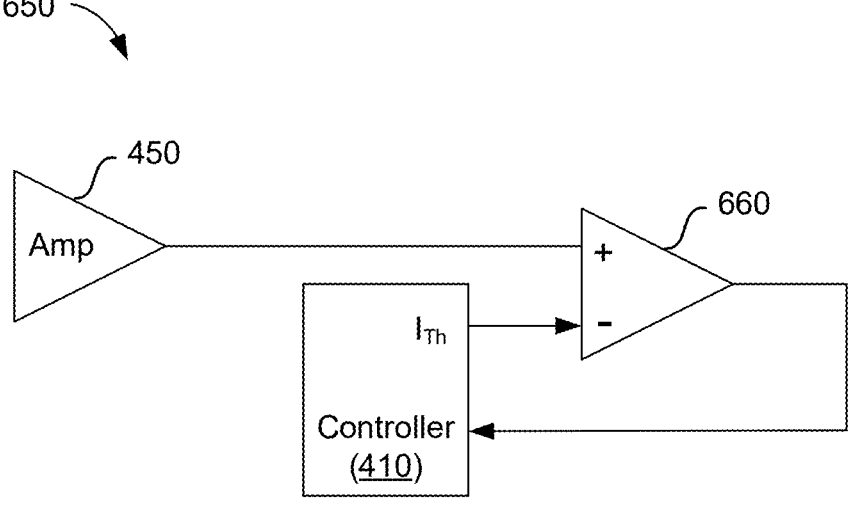
FIG. 6B is a schematic diagram of a circuit that can determine the trip point for a OCP brownout protection feature according to some embodiments.

Referring first to FIG. 5, method 500 can start by receiving a request or instruction to initiate a lost mode operation (block 510) in which charging case 300 is instructed to play a chime on speaker 316. In some embodiments, the lost mode operation can be initiated through a location-based finding scheme, such as Find My Device developed by Apple, Inc. Embodiments are not limited to a any particular finding scheme, however, and can encompass any request that is received by charging case 300 in which it is desirable to play speaker 316 at its maximum volume without initiating a brownout condition.

Next, the peak load point in the particular audio asset (e.g., stored chime sequence) that is to be played by charging case 300 is identified (block 520). As discussed above, in some embodiments the audio asset can be stored in an external memory and, in response to an instruction, loaded into an internal memory of controller 410 prior to being played. The peak load point of the audio asset can be stored in metadata associated with the audio asset and is assumed to be constant once it is hit for the maximum duration of the ramping process.

The audio asset is then first played at a volume that is expected to be well below a volume level that might cause a brownout condition (block 530). In some embodiments, the initial volume can be a predetermined volume and in other embodiments the initial volume can be selected from a lookout table based on various criteria such as battery age and temperature.

The audio asset can be a relatively short clip that is repeated multiple times as part of chime sequence (block 540). As non-limiting examples, the audio clip may be anywhere from 0.5 seconds to 2.0 seconds in length and contain a sequence of tones that makes it unique among the various audio assets stored within a memory of charging case 300. A particular chime sequence might repeat the audio asset a number of time, pause for predetermined time and then repeat the playing/pausing sequence throughout the duration of the lost mode operation. Arrow 542 represents the continuous playing of the audio asset as part of a repeating chime sequence until the charging case receives an instruction to stop the chime sequence or times out.

As the audio asset is played through speaker 316 (block 540), controller 410 starts ramping the gain for the audio asset (i.e., increasing the volume of the chime) from the peak load point, from a minimum level to a maximum level (block 562). During this time, audio clamp 470 monitors both the battery voltage and battery current to determine if the voltage is likely to drop to a level that would cause a brownout condition or that the current is likely to be increased to a level that would cause a brownout condition (block 550).

In one embodiment, block 550 is carried out by circuitry that includes two separate analog comparators. FIGS. 6A and 6B depict one embodiment of such circuitry. Specifically, FIG. 6A, is a simplified schematic diagram of a first circuit 600 that measures battery voltage while the chime sequence is playing (block 552) and includes a first comparator 610. Comparator 610 compares a voltage level of battery 440 received at a first input with a threshold voltage (V$_{TH}$) received at a second input. The threshold voltage can be stored in controller 410 and is selected to be a voltage that is slightly higher than the minimum battery voltage required by circuitry within charging case 300 (e.g., controller 410) to operate. Thus, in some embodiments, V$_{TH}$ is selected to be slightly above the UVLO threshold. An output of comparator 610 can be received by controller 410.

Similarly, FIG. 6B is a simplified schematic diagram of a second circuit 650 that measures battery current while the chime sequence is playing (block 554) and includes a second comparator 660. Comparator 660 compares a current level at the output of amplifier 450 (i.e., the input to speaker 316) received at a first input with a threshold current (I$_{TH}$) received at a second input. The threshold current can be stored in controller 410 and is selected to be a current that is slightly lower than the current level output from battery 440 that would cause a brownout condition. Thus, in some embodiments, I$_{TH}$ is selected to be slightly below the OCP threshold. An output of comparator 660 can be received by controller 410.

If either of comparators 610 or 660 are tripped (block 560; i.e., comparator 610 indicates that the voltage of battery 440 has dropped below V$_{TH}$ or comparator 660 indicates that the current input to speaker 316 is above I$_{TH}$), controller 410 can generate an interrupt that immediately stops the process in which the speaker gain is continuously ramped up (block

564). output of comparator 410 changes. The gain at this point is the maximum gain that the audio asset used in the chime sequence for the lost mode operation can be played at.

Once lost mode is initiated, method 500 can continuously play the audio chime until the charging case receives an instruction to stop the chime sequence or times out (block 570). In some implementations, continuously playing the chime can include resetting the chime to a low gain (block 530) and then determining whether the previously determined maximum gain should be altered based on current conditions. Such resetting to block 530 can occur after a predetermined time that the chime sequence is played (e.g., 5 seconds, 30 seconds, 1 minute, etc.), after a predetermined number of chime sequences are played (e.g., after every chime sequence, after every 10 chime sequences, after every 25 chime sequences, etc.) or can even occur at a fractional point of a time sequence (e.g., after every individual chime in a sequence, at a halfway point of a chime sequence, etc.).

Figures 7A, 7B:
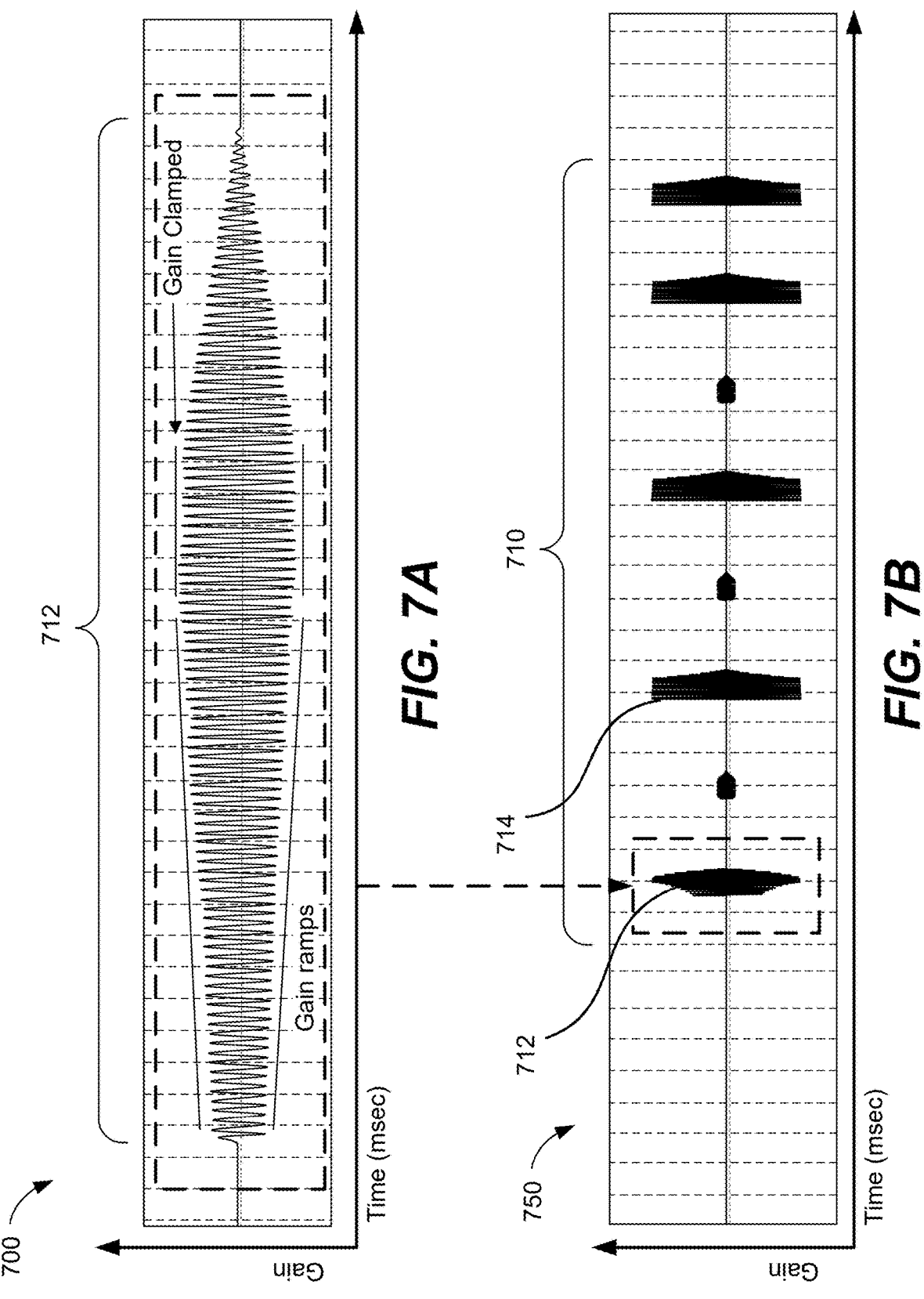
FIGS. 7A and 7B are simplified graphs of the gain applied to a speaker while playing a chime sequence for one particular audio asset in accordance with an embodiment.

To illustrate an example of method 500, reference is made to FIGS. 7A and 7B that are simplified graphs 700 and 750, respectively, of the gain applied to speaker 316 during blocks 530 and 540 for one particular audio asset in accordance with an embodiment. In each graph, time is represented along the x-axis and gain (voltage) is represented along the y-axis. As shown in FIG. 7B, the depicted audio asset 710 consists of five relatively loud audio pulses (e.g., beeps) with three relatively soft audio pulses interleaved with the first three louder pulses. In some embodiments, the entirety of the audio asset can be less than two seconds long and can be repeated multiple times to make up a chime sequence.

FIG. 7A is an exploded view of a first audio pulse 712 of chime 710 that is intended to be played during a lost mode at the loudest volume allowed by charging case 300. When first played, audio pulse 712 starts off at an initial gain level based on the peak load point of audio asset 710 as described in conjunction with FIG. 5, block 530. The gain of the audio asset is repeatedly increased over time (FIG. 5, block 560, 562) until it reaches a maximum level where higher than the maximum has been determined likely to trigger a brownout condition as determined by audio clamp circuit 470 (FIG. 5, block 560, 564). Once the maximum gain has been identified, the next audio pulse 714 in chime 710 (as well as other subsequent audio pulses) can be immediately played at the maximum (clamped) level.

Situation-Specific Volume Control

Some other embodiments disclosed herein can adjust the volume of an audio asset (e.g., an audio asset that indicates charging has been initiated, or a pairing process has started) played over speaker 316 based on external factors, such as ambient volume, the location of the charging case, and/or the time of the day. For example, if the charging case is in a noisy environment, the audio asset can be played at a volume that is higher than if the charging case is in a quiet environment. Similarly, the audio asset could be played softly at certain times of the day or night based on user defined settings (during bedtime hours) and played more loudly at other times.

Additional Embodiments

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while the functionality of embodiments described herein is discussed with a respect to certain hardware components, a person of skill in the art will recognize that many different combinations of hardware components can be used to perform the described functions, Thus, as an example, embodiments are not limited to the specific hardware units described as circuitry 400 and other embodiments can implement the same circuitry with combinations of integrated circuits and discrete electronic components that are different from the examples set forth herein.

Also, while different embodiments of the invention were disclosed above, the specific details of particular embodiments may be combined in any suitable manner without departing from the spirit and scope of embodiments of the invention. Further, it will be apparent to one of ordinary skill in the art that many modifications and variations are possible in view of the above teachings. As one example, while many of the embodiments discussed above pertain to methods and systems for controlling the volume of a speaker or similar audio device within a charging case for wireless earphones, embodiments are not so limited. A skilled artisan will appreciate that the concepts and techniques described herein, including the techniques and circuitry to maximize chime volume, can be useful for a storage and/or charging case for other types of portable electronic devices that include a speaker or similar an audio device and can be useful for other electronic devices that include a controller, a rechargeable battery, a speaker and appropriate circuitry that controls the volume of the speaker in the manner disclosed herein. Examples of such electronic devices can include, among others, wireless earphones, smart watches, and portable media players including smart phones.

Finally, it is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A charging case for a pair of wireless earphones, the charging case comprising:

a housing having a peripheral wall that defines a shell and one or more audio openings formed through the peripheral wall;

a frame insert coupled to the housing and extending into the shell, the frame insert having one or more insert walls that define first and second pockets sized and shaped to accept first and second wireless earphones, respectively; wherein the one or more insert walls cooperate with the housing peripheral wall to define a interior cavity within the charging case;

a lid coupled to the housing and operable between a closed position in which the lid covers the first and second pockets and an open position in which the first and second pockets are exposed;

a rechargeable battery disposed within the interior cavity;

a speaker disposed within the interior cavity and aligned to emit sound through the one or more openings; and circuitry coupled to the rechargeable battery and the speaker and configured to:

initiate playing an audio asset on the speaker at a first gain level;

while continuing to play the audio asset, increase a gain level of the speaker from the first gain level to a final gain level by repeating a sequence of: (i) measuring a system load on the rechargeable battery and (ii) increase the gain level of the speaker, until the measured system load reaches a threshold level; and after the measured system load reaches the threshold level, set the gain level of the speaker at the final gain level and continue playing the audio asset with the gain set at the final gain level.

2. The charging case set forth in claim 1 wherein measuring the system load on the rechargeable battery comprises determining a voltage level provided by the rechargeable battery and wherein the circuitry determines if the measured system load reaches the threshold level by comparing the voltage provided by the rechargeable battery to a threshold voltage level.

3. The charging case set forth in claim 1 wherein measuring the system load on the rechargeable battery comprises determining a current level provided by the battery and wherein the circuitry determines if the measured system load reaches the threshold level by comparing the current level provided by the rechargeable battery to a threshold current level.

4. The charging case set forth in claim 1 wherein the circuitry comprises wireless communication circuitry operable to receive a lost mode command from a host device and a controller operable to respond to the lost mode command by playing the audio asset on the speaker.

5. The charging case set forth in claim 1 wherein the circuitry comprises an amplifier having an output coupled to the speaker and a microcontroller having an serial audio interface coupled to the amplifier.

6. The charging case set forth in claim 1 wherein the circuitry comprises a controller and a power management circuit configured to provide a battery under voltage lock out (UVLO) that initiates a reset of the controller if the voltage provided by the battery drops below a threshold voltage level.

7. The charging case set forth in claim 6 wherein the threshold voltage level is stored in the controller, and wherein the circuitry further comprises:

an audio clamping circuit comprising a comparator having a first input coupled to receive the threshold voltage level from the controller and a second input coupled to a voltage level of the battery.

8. The charging case set forth in claim 1 wherein the circuitry comprises a controller and a power management circuit configured to provide a battery overcurrent protection (OCP) feature that initiates a reset of the controller if a current level delivered by the rechargeable battery to the speaker raises above a threshold current level.

9. The charging case set forth in claim 8 wherein the threshold current level is stored in the controller, and wherein the circuitry further comprises:

an amplifier coupled at an output to the speaker; and an audio clamping circuit comprising a comparator having a first input coupled to receive the threshold current level from the controller and a second input coupled to the output of the amplifier.

10. The charging case set forth in claim 1 further comprising a memory that stores the audio asset.

11. The charging case set forth in claim 10 wherein the circuitry comprises wireless communication circuitry operable to receive a lost mode command from a host device and a controller operable to respond to the lost mode command by playing the audio asset on the speaker.

12. The charging case set forth in claim 11 wherein the memory is an external memory that stores a plurality of audio assets and the controller is operable to select one of the plurality of audio assets from the external memory to load into a memory of the controller.

13. The charging case set forth in claim 1 wherein:
the circuitry is configured to store a plurality of audio assets;
the step of initiate playing an audio asset on the speaker at a first gain level plays a first audio asset in the plurality of assets in response to the charging case receiving a first command instruction; and
the circuitry is further configured to play a second audio asset, different than the first audio asset in response to receiving a second command instruction, different than the first command instruction.

14. The charging case set forth in claim 13 wherein the circuitry is further configured to, when playing the second audio asset, set the gain of the speaker to a level that is determined based on an environmental condition external to the charging case.

15. The charging case set forth in claim 14 wherein the environmental condition external to the charging case is one of: an ambient volume, a location of the charging case or a time of day.

16. The charging case set forth in claim 1, wherein the circuitry coupled to the rechargeable battery and the speaker is configured to set the initial gain level to a value below a maximum, and the sequence of increasing and measuring gain is performed prior to the circuitry detecting any system depletion or unsafe condition.

17. The charging case set forth in claim 16, wherein increasing the gain level of the speaker comprises incrementally increasing the gain in discrete steps and, after each step, measuring the system load before determining whether to further increase the gain.

18. The charging case set forth in claim 17, wherein the circuitry coupled to the rechargeable battery and the speaker is configured such that the gain level is not decreased during playback unless the measured system load exceeds a safety threshold, and wherein the maximum gain level is empirically determined for each playback session.

19. The charging case set forth in claim 16 wherein the circuitry coupled to the rechargeable battery and the speaker is further configured to, after the gain level is set to the final gain level, maintaining the gain at that value for the remainder of the audio asset playback, unless a system load threshold is exceeded.

20. The charging case set forth in claim 1 wherein measuring of system load and increasing of gain are performed by the circuitry automatically and continuously during an initial portion of playback of the audio asset, and wherein the final gain level is determined empirically based on real-time measurements of the rechargeable battery load.

21. A storage case for a portable electronic device, the storage case comprising:
a housing defining a device storage area;
a lid coupled to the housing and operable between a closed position in which the lid covers the device storage area and an open position in which the device storage area first and second pockets are exposed;
a rechargeable battery;
a speaker; and
circuitry coupled to the rechargeable battery and the speaker and configured to:
initiate playing an audio asset on the speaker at a first gain level;
while continuing to play the audio asset, increase a gain level of the speaker from the first gain level to a final gain level by repeating a sequence of measuring a system load on the rechargeable battery and increasing the gain level of the speaker until the measured system load reaches a threshold level; and
after the measured system load reaches the threshold level, set the gain level of the speaker at the final gain level and continue playing the audio asset with the gain set at the final gain level.

22. The storage case for a portable electronic device set forth in claim 21 wherein the storage case is configured to store first and second wireless earphones.

23. The storage case for a portable electronic device set forth in claim 22 wherein the housing comprises a peripheral wall that defines a shell and includes one or more audio openings formed through the peripheral wall, and wherein the storage case further comprises a frame insert, coupled to the housing, and extending into the shell, the frame insert having one or more insert walls that define first and second pockets sized and shaped to accept first and second wireless earphones, respectively.

24. An electronic device comprising:
a controller;
a rechargeable battery;
a speaker; and
circuitry coupled to the rechargeable battery and the speaker and configured to:
initiate playing an audio asset on the speaker at a first gain level;
while continuing to play the audio asset, increase a gain level of the speaker from the first gain level to a final gain level by repeating a sequence of measuring a system load on the rechargeable battery and increasing the gain level of the speaker until the measured system load reaches a threshold level; and
after the measured system load reaches the threshold level, set the gain level of the speaker at the final gain level and continue playing the audio asset with the gain set at the final gain level.

25. The electronic device set forth in claim 24 wherein the electronic device is a storage case for a pair of wireless earphones.

* * * * *